United States Patent
Hsieh et al.

(10) Patent No.: US 11,056,999 B2
(45) Date of Patent: Jul. 6, 2021

(54) OSCILLATOR AND OPERATION METHOD THEREOF

(71) Applicant: Winbond Electronics Corp., Taichung (TW)

(72) Inventors: Ping-Hsuan Hsieh, Taichung (TW); Sheng-Yen Hsu, Taichung (TW); Ming-Li Tang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/538,838

(22) Filed: Aug. 13, 2019

(65) Prior Publication Data
US 2020/0336102 A1 Oct. 22, 2020

(30) Foreign Application Priority Data

Apr. 17, 2019 (TW) .................................. 108113450

(51) Int. Cl.
| | | |
|---|---|---|
| H03B 5/12 | (2006.01) | |
| H03B 5/24 | (2006.01) | |
| H03B 5/00 | (2006.01) | |
| H03K 19/20 | (2006.01) | |

(52) U.S. Cl.
CPC ............... *H03B 5/00* (2013.01); *H03K 19/20* (2013.01)

(58) Field of Classification Search
CPC .................................. H03B 5/00; H03K 19/20
USPC ...................................... 331/108 R, 111, 143
See application file for complete search history.

(56) References Cited

U.S. PATENT DOCUMENTS 9,379,664 B2   6/2016 Zidan et al.
10,026,476 B2 * 7/2018 Chia .................... B41J 2/04541

FOREIGN PATENT DOCUMENTS

| CN | 202652146 | 1/2013 |
|---|---|---|
| CN | 108109654 | 6/2018 |

OTHER PUBLICATIONS

"Office Action of Taiwan Counterpart Application," dated Aug. 29, 2019, p. 1-p. 4.
D.S.Yu et al., "A Memristive Astable Multivibrator Based on 555 Timer", 2015 IEEE International Symposium on Circuits and Systems (ISCAS), Jul. 30, 2015, pp. 858-861.
Dmitri B. Strukov et al., "The missing memristor found", Nature, vol. 453, May 1, 2008, pp. 1-5.

(Continued)

*Primary Examiner* — Richard Tan
(74) *Attorney, Agent, or Firm* — JCIPRNET

(57) ABSTRACT

An oscillator and an operation method thereof are provided. The oscillator includes a current source, a memristor, a switching circuit, and a control circuit. The switching circuit is coupled to the current source and the memristor. The switching circuit is configured to transmit a bias current provided by the current source to the memristor, and determine a flow direction of the bias current in the memristor according to at least one control signal. The control circuit is coupled to the switching circuit to provide the at least one control signal. The control circuit is configured to detect a representative voltage of the memristor. The control circuit changes the at least one control signal according to a relationship between the representative voltage, a first threshold voltage, and a second threshold voltage to change the flow direction of the bias current in the memristor.

9 Claims, 4 Drawing Sheets

(56) References Cited

OTHER PUBLICATIONS

Yi Shen et al., "Realization of a memristor-based second-order active low-pass filter", International Conference on Information Science and Technology (IC1ST), Apr. 2015, pp. 1-5.

Yibin Hong et al., "A memristor-based continuous-time digital FIR filter for biomedical signal processing", IEEE Transactions on Circuits and Systems—I: Regular Papers, vol. 62, Issue 5, May 2015, pp. 1392-1401.

Mohamed E. Fouda et al., "Generalized Analysis of Symmetric and Asymmetric Memristive Two-Gate Relaxation Ossillators", IEEE Transactions on Circuits and Systems—I: Regular Papers, vol. 60, Issue 10, Oct. 2013, pp. 2701-2708.

* cited by examiner

OSCILLATOR AND OPERATION METHOD THEREOF

CROSS-REFERENCE TO RELATED APPLICATION

This application claims the priority benefit of Taiwan application serial no. 108113450, filed on Apr. 17, 2019. The entirety of the above-mentioned patent application is hereby incorporated by reference herein and made a part of this specification.

BACKGROUND OF THE INVENTION

Field of the Invention

The disclosure relates to an electronic circuit, and more particularly, to an oscillator and an operation method thereof.

Description of Related Art

The memristor has received much attention in the past few years. The memristor may be applied to various circuits, including active low-pass filters and continuous time digital FIR filters.

The information disclosed in this Background section is only for enhancement of understanding of the invention. Some (or all) of the information disclosed in the Background section may not be prior art that is already known to a person of ordinary skill in the art. Further, the information disclosed in the Background section does not mean that the information was known to a person of ordinary skill in the art prior to the filing of the application.

SUMMARY OF THE INVENTION

The invention provides an oscillator and an operation method thereof in which a memristor is applied.

An embodiment of the invention provides an oscillator. The oscillator includes a current source, a memristor, a switching circuit, and a control circuit. The switching circuit is coupled to the current source and the memristor. The switching circuit is configured to transmit a bias current provided by the current source to the memristor, and determine a flow direction of the bias current in the memristor according to at least one control signal. The control circuit is coupled to the switching circuit to provide the at least one control signal. The control circuit is configured to detect a representative voltage of the memristor. The control circuit changes the at least one control signal according to a relationship between the representative voltage, a first threshold voltage, and a second threshold voltage, so as to change the flow direction of the bias current in the memristor.

An embodiment of the invention provides an operation method of an oscillator. The operation method includes the following steps. A current source provides a bias current. A switching circuit transmits the bias current provided by the current source to a memristor. A control circuit detects a representative voltage of the memristor. The control circuit changes and provides at least one control signal according to a relationship between the representative voltage, a first threshold voltage, and a second threshold voltage. The switching circuit changes a flow direction of the bias current in the memristor according to the at least one control signal.

Based on the above, in the oscillator and the operation method thereof of the embodiments of the invention, through performing the set operation and the reset operation on the memristor, the resistance value (the representative voltage) of the memristor can be increased/decreased. In other words, through changing the flow direction of the bias current in the memristor, the resistance value (the representative voltage) of the memristor is increased/decreased. According to the relationship between the representative voltage of the memristor, the first threshold voltage, and the second threshold voltage, the control circuit may automatically change the flow direction of the bias current in the memristor.

To make the aforementioned more comprehensible, several embodiments accompanied with drawings are described in detail as follows.

DESCRIPTION OF THE EMBODIMENTS

Figure 1:
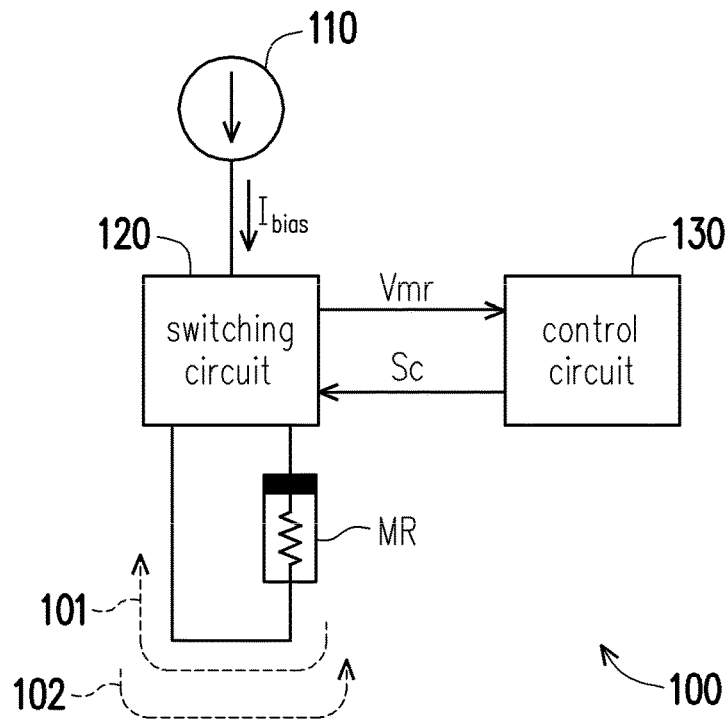
FIG. 1 is a circuit block diagram showing an oscillator according to an embodiment of the invention.

The term "couple or (connect)" used throughout the specification (including the claims) herein may refer to any direct or indirect connection means. For example, if a first device is described to be coupled (or connected) to a second device in the text, it is interpreted that the first device may be directly connected to the second device, or that the first device may be indirectly connected to the second device via other devices or some connection means. Moreover, wherever possible, elements/components/steps labeled with the same reference numerals represent the same or similar parts in the drawings and embodiments. Reference may be made between the elements/components/steps labeled with the same reference numerals or described in the same terms in different embodiments for relevant descriptions.

Herein, an application of a memristor will be described in the following embodiments. That is, the following embodiments will introduce a memristor-based oscillator. A bias current flows through the memristor in alternating directions to generate a voltage (i.e., a representative voltage of the memristor). A control circuit may compare the representative voltage of the memristor with two threshold voltages and correspondingly control the current direction of the memristor according to the comparison result to perform oscillation.

FIG. 1 is a circuit block diagram showing an oscillator 100 according to an embodiment of the invention. The oscillator 100 shown in FIG. 1 includes a current source 110, a switching circuit 120, a control circuit 130, and a memristor MR. The current source 110 may provide a bias current $I_{bias}$ to the switching circuit 120. The bias current $I_{bias}$ may be a constant current or another current. The bias current $I_{bias}$ is dependent on the component specification and characteristics of the memristor MR. The bias current $I_{bias}$ may be determined according to the design requirements. The switching circuit 120 is coupled to the current source 110 and the memristor MR. The switching circuit 120 may transmit the bias current $I_{bias}$ provided by the current source 110 to the memristor.

A top electrode and a bottom electrode of the memristor MR are coupled to different current terminals of the switching circuit 120. The switching circuit 120 may determine the flow direction of the bias current $I_{bias}$ in the memristor MR according to at least one control signal Sc. For example, when the at least one control signal Sc indicates a first logic value, the switching circuit 120 may set the flow direction of the bias current $I_{bias}$ in the memristor MR to a flow direction 101 shown in FIG. 1. When the at least one control signal Sc indicates a second logic value, the switching circuit 120 may set the flow direction of the bias current $I_{bias}$ in the memristor MR to a flow direction 102 shown in FIG. 1.

The memristor MR may be implemented in any form according to the design requirements. For example, the memristor MR may be a conventional memristor or another memristor. The resistance value of the memristor MR may be reversibly changed by the direction of the current applied between the top electrode and the bottom electrode. For example, when the bias current $I_{bias}$ flows from the top electrode to the bottom electrode of the memristor MR (e.g., the direction 101 shown in FIG. 1), the bias current $I_{bias}$ sets the resistance state of the memristor MR to a high resistance state (increasing the resistance value of the memristor MR). When the bias current $I_{bias}$ flows from the bottom electrode to the top electrode of the memristor MR (e.g., the direction 102 shown in FIG. 1), the bias current $I_{bias}$ sets the resistance state of the memristor MR to a low resistance state (reducing the resistance value of the memristor MR).

The control circuit 130 is coupled to the switching circuit 120 to provide the at least one control signal Sc. The control circuit 130 may detect a representative voltage Vmr of the memristor MR. The representative voltage Vmr is dependent on the resistance value of the memristor MR. For example, in the case where the bias current $I_{bias}$ flowing through the memristor MR is a constant current, the larger the resistance value of the memristor MR is, the larger the representative voltage Vmr is. The control circuit 130 may change the at least one control signal Sc according to a relationship between the representative voltage Vmr, a threshold voltage VH, and a threshold voltage VL to change the flow direction of the bias current $I_{bias}$ in the memristor MR. The threshold voltage VH is greater than the threshold voltage VL, and the threshold voltage VH and the threshold voltage VL may be determined according to the design requirements. According to the design requirements, the control circuit 130 may be a combinational circuit, a microcontroller, or another control circuit.

Figure 2:
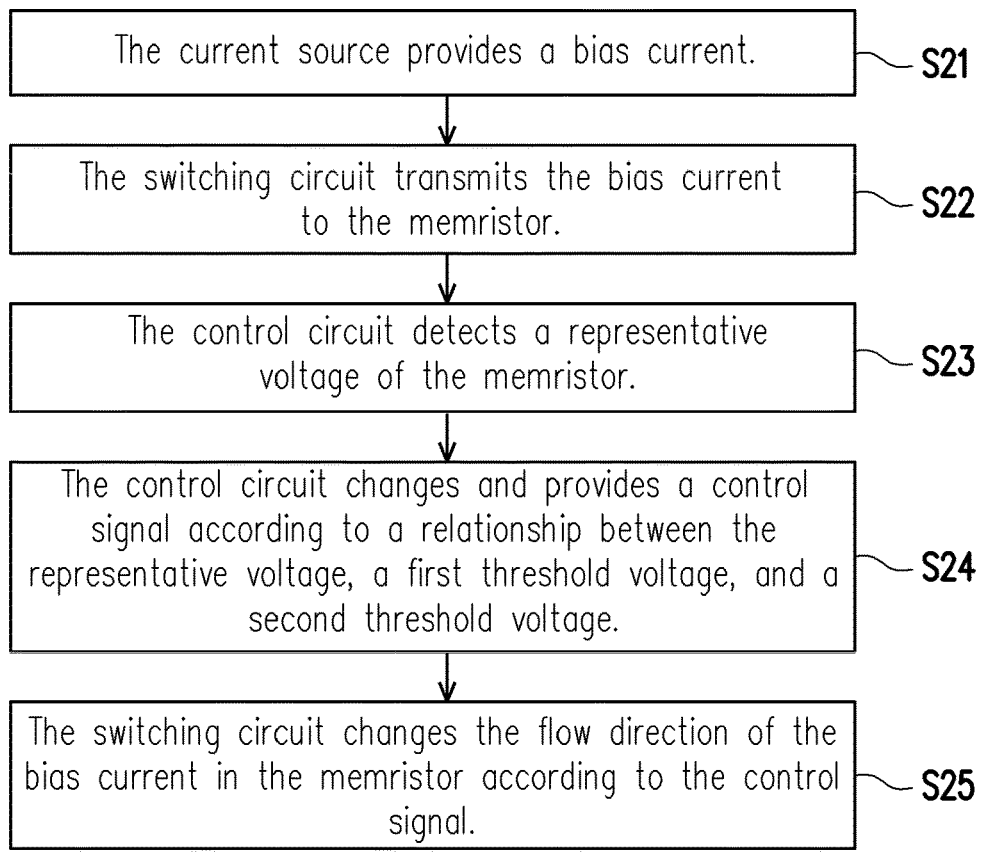
FIG. 2 is a flowchart showing an operation method of an oscillator according to an embodiment of the invention.

FIG. 2 is a flowchart showing an operation method of the oscillator 100 according to an embodiment of the invention. Referring to FIG. 1 and FIG. 2, in step S21, the current source 110 may provide a bias current $I_{bias}$ to the switching circuit 120. In step S22, the switching circuit 120 may transmit the bias current $I_{bias}$ provided by the current source 110 to the memristor MR based on control of at least one control signal Sc. In step S23, the control circuit 130 may detect a representative voltage Vmr of the memristor MR. In step S24, the control circuit 130 changes and provides the at least one control signal Sc to the switching circuit 120 according to a relationship between the representative voltage Vmr, the threshold voltage VH, and the threshold voltage VL. In step S25, the switching circuit 120 may change the flow direction of the bias current $I_{bias}$ in the memristor MR according to the at least one control signal Sc.

The switching circuit 120, the control circuit 130, and the memristor MR may form a feedback loop. The feedback loop performs oscillation to provide a clock signal (periodically oscillating signal). In some application examples, the control circuit 130 may compare the representative voltage Vmr with the threshold voltage VH (and/or the threshold voltage VL) to obtain a comparison result, and the comparison result may be used as the clock signal. In other application examples, the representative voltage Vmr may be used as the clock signal. In still other application examples, the at least one control signal Sc may be used as the clock signal.

Figure 3:
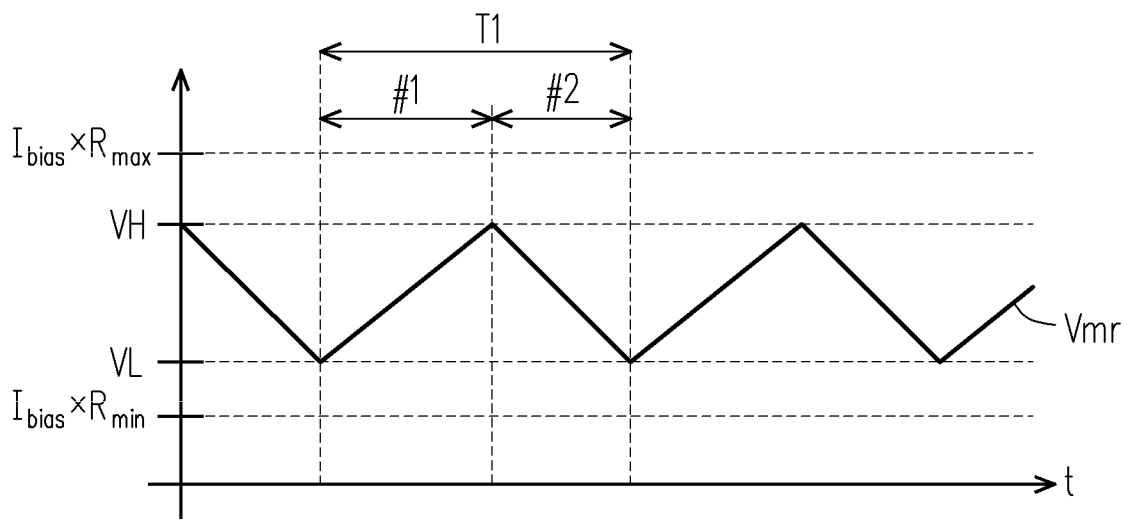
FIG. 3 is a waveform diagram illustrating a representative voltage of a memristor shown in FIG. 1 according to an embodiment of the invention.

FIG. 3 is a waveform diagram illustrating the representative voltage Vmr of the memristor MR shown in FIG. 1 according to an embodiment of the invention. The horizontal axis shown in FIG. 3 represents a time t, and the vertical axis represents a voltage V. In the embodiment shown in FIG. 3, $I_{bias}$ represents the bias current, $R_{max}$ represents the maximum resistance value of the memristor MR, and $R_{min}$ represents the minimum resistance value of the memristor MR. As shown in FIG. 3, an oscillating cycle T1 of the representative voltage Vmr includes a phase #1 and a phase #2.

Referring to FIG. 1 and FIG. 3, when the flow direction of the bias current $I_{bias}$ in the memristor MR is the direction 101 and causes the resistance value of the memristor MR to increase, the oscillator 100 is in the phase #1 in the oscillating cycle T1. In the phase #1, the resistance value of the memristor MR increases over time. In the case where the bias current $I_{bias}$ flowing through the memristor MR is a constant current, the representative voltage Vmr increases over time in the phase #1. The control circuit 130 may compare the representative voltage Vmr with the threshold voltage VH in the phase #1. In the phase #1, when the representative voltage Vmr of the memristor MR is not less than the threshold voltage VH, the control circuit 130 may change the at least one control signal Sc to end the phase #1 and enter the phase #2. In other words, based on the control of the control signal Sc, the switching circuit 120 changes the current direction of the memristor MR from the direction 101 to the direction 102.

When the flow direction of the bias current $I_{bias}$ in the memristor MR is the direction 102 and causes the resistance value of the memristor MR to decrease, the oscillator 100 is in the phase #2 in the oscillating cycle T1. In the phase #2, the resistance value of the memristor MR decreases over time. In the case where the bias current $I_{bias}$ flowing through the memristor MR is a constant current, the representative voltage Vmr decreases over time in the phase #2. The control circuit 130 may compare the representative voltage Vmr with the threshold voltage VL in the phase #2. In the phase #2, when the representative voltage Vmr of the memristor MR is not greater than the threshold voltage VL, the control circuit 130 may change the at least one control signal Sc to end the phase #2 and enter the phase #1. In other words, based on the control of the control signal Sc, the switching circuit 120 changes the current direction of the memristor MR from the direction 102 to the direction 101.

The oscillator 100 may increase/decrease the resistance value of the memristor MR through performing a set operation and a reset operation on the memristor MR. In other words, through changing the flow direction of the bias current $I_{bias}$ in the memristor MR, the resistance value of the memristor MR can be increased/decreased (namely, the representative voltage Vmr can be increased/decreased). According to the relationship between the representative voltage Vmr of the memristor MR, the threshold voltage VH, and the threshold voltage VL, the control circuit 130 may automatically change the flow direction of the bias current $I_{bias}$ in the memristor MR to perform oscillation.

Figure 4:
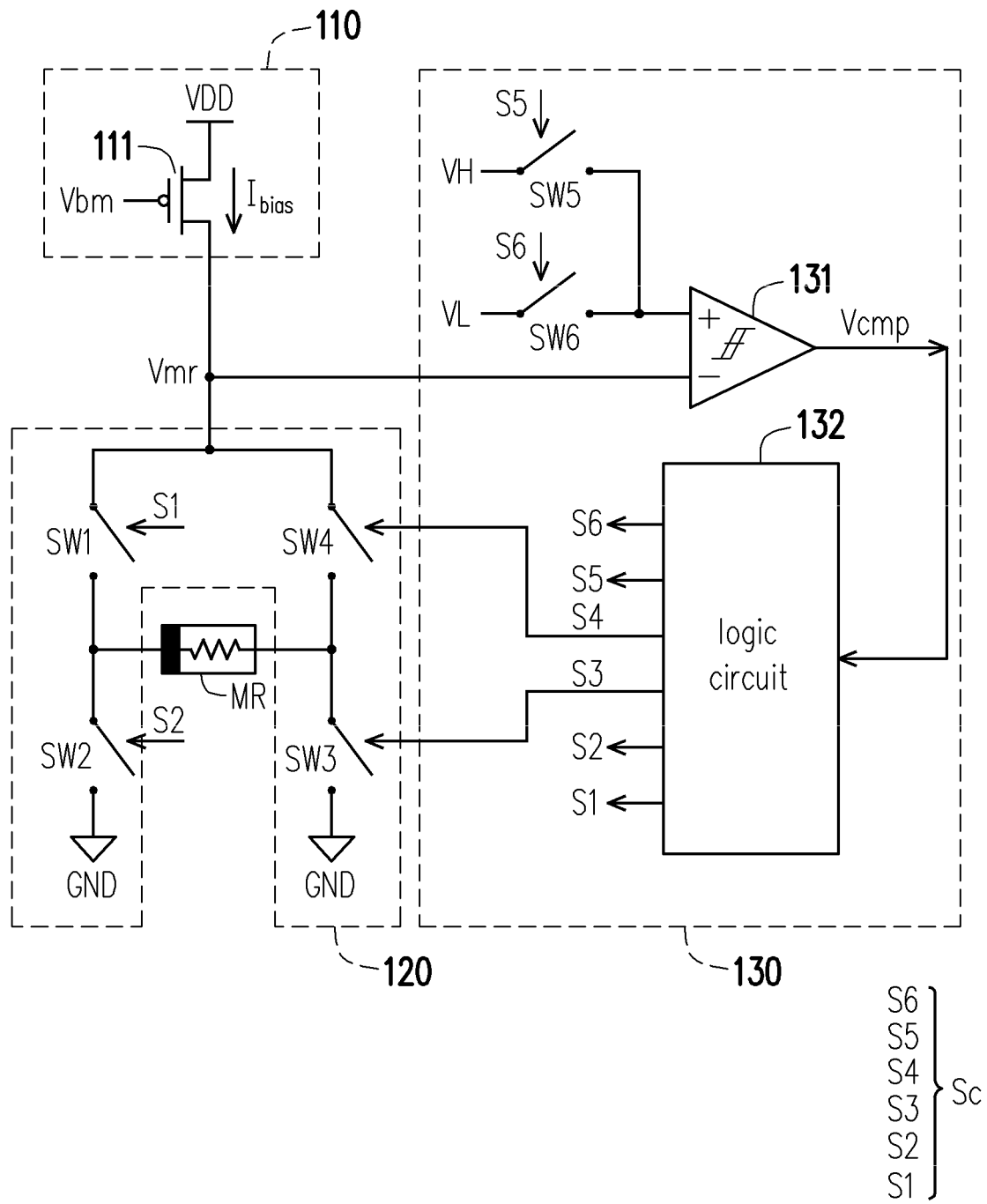
FIG. 4 is a circuit block diagram illustrating a switching circuit and a control circuit shown in FIG. 1 according to an embodiment of the invention.

FIG. 4 is a circuit block diagram illustrating the switching circuit 120 and the control circuit 130 shown in FIG. 1 according to an embodiment of the invention. Referring to FIG. 1 and FIG. 4, in the embodiment shown in FIG. 4, the current source 110 includes a transistor 111. According to the design requirements, the transistor 111 may be a metal oxide semiconductor (MOS) transistor, a bipolar junction transistor (BJT), or another transistor. The first terminal (e.g., the source) of the transistor 111 is coupled to a system voltage VDD. The second terminal (e.g., the drain) of the transistor 111 is coupled to the switching circuit 120 to provide the bias current $I_{bias}$. The control terminal (e.g., the gate) of the transistor 111 is coupled to a bias voltage Vbm. The bias voltage Vbm may be a fixed voltage or another voltage. The level of the bias voltage Vbm may be determined according to the design requirements. Based on adjustment of the bias voltage Vbm, the bias current $I_{bias}$ may be changed correspondingly.

In the embodiment shown in FIG. 4, the switching circuit 120 includes a switch SW1, a switch SW2, a switch SW3, and a switch SW4. The first terminal of the switch SW1 is coupled to the current source 110 to receive the bias current $I_{bias}$. The second terminal of the switch SW1 is coupled to the first terminal of the memristor MR. The control terminal of the switch SW1 is coupled to the control circuit 130 to receive a control signal S1 of the at least one control signal Sc. The first terminal of the switch SW2 is coupled to the first terminal of the memristor MR. The second terminal of the switch SW2 is coupled to a reference voltage GND. The control terminal of the switch SW2 is coupled to the control circuit 130 to receive a control signal S2 of the at least one control signal Sc. The first terminal of the switch SW3 is coupled to the second terminal of the memristor MR. The second terminal of the switch SW3 is coupled to the reference voltage GND. The control terminal of the switch SW3 is coupled to the control circuit 130 to receive a control signal S3 of the at least one control signal Sc. The first terminal of the switch SW4 is coupled to the current source 110 to receive the bias current $I_{bias}$. The second terminal of the switch SW4 is coupled to the second terminal of the memristor MR. The control terminal of the switch SW4 is coupled to the control circuit 130 to receive a control signal S4 of the at least one control signal Sc.

When the oscillator 100 is in the phase #1 in the oscillating cycle T1, the control circuit 130 may turn on the switch SW1 and the switch SW3 and turn off the switch SW2 and the switch SW4. When the oscillator 100 is in the phase #2 in the oscillating cycle T1, the control circuit 130 may turn off the switch SW1 and the switch SW3 and turn on the switch SW2 and the switch SW4.

In the embodiment shown in FIG. 4, the control circuit 130 includes a switch SW5, a switch SW6, a comparator 131, and a logic circuit 132. The first terminal of the switch SW5 is coupled to the threshold voltage VH. The control terminal of the switch SW5 is coupled to the logic circuit 132 to receive a control signal S5. The first terminal of the switch SW6 is coupled to the threshold voltage VL. The control terminal of the switch SW6 is coupled to the logic circuit 132 to receive a control signal S6. The first input terminal (e.g., the non-inverting input terminal) of the comparator 131 is coupled to the second terminal of the switch SW5 and the second terminal of the switch SW6. The second input terminal (e.g., the inverting input terminal) of the comparator 131 is coupled to the first terminal of the switch SW1 and the first terminal of the switch SW4 to receive the representative voltage Vmr of the memristor MR.

The input terminal of the logic circuit 132 is coupled to the output terminal of the comparator 131 to receive a comparison result Vcmp. The logic circuit 132 may provide the at least one control signal Sc (the control signal S1, the control signal S2, the control signal S3, the control signal S4, the control signal S5, and the control signal S6) to the switches SW1 to SW6 according to the comparison result Vcmp. According to the design requirements, the logic circuit 132 may be a combinational circuit, a microcontroller, or another logic circuit. When the comparison result Vcmp indicates that the representative voltage Vmr of the memristor MR is less than the threshold voltage VH, the logic circuit 132 turns on the switch SW1, the switch SW3, and the switch SW5 and turns off the switch SW2, the switch SW4, and the switch SW6. When the comparison result Vcmp indicates that the representative voltage Vmr of the memristor MR is greater than the threshold voltage VL, the logic circuit 132 may turn off the switch SW1, the switch SW3, and the switch SW5 and turn on the switch SW2, the switch SW4, and the switch SW6. The truth table of the logic circuit 132 is as shown in Table 1.

TABLE 1

| Truth table of logic circuit 132 | | | | | | | |
|---|---|---|---|---|---|---|---|
| Vcmp | Phase | S1 | S2 | S3 | S4 | S5 | S6 |
| 1 | #1 | 1 | 0 | 1 | 0 | 1 | 0 |
| 0 | #2 | 0 | 1 | 0 | 1 | 0 | 1 |

As shown in the timing diagram of FIG. 3, the operation of the phase #1 alternates with the operation of the phase #2, such that the bias current $I_{bias}$ flows through the memristor MR in two opposite directions (i.e., the direction 101 and the direction 102). The representative voltage Vmr as shown in FIG. 3 oscillates in a triangular waveform. Through changing the bias current $I_{bias}$ and the voltage range (i.e., VH-VL), the operating frequency of the oscillator 100 can be adjusted. It is note that the threshold voltage VH has to be less than the product of the maximum resistance value of the memristor MR and the bias current $I_{bias}$, and the threshold voltage VL has to be greater than the product of the minimum resistance value of the memristor MR and the bias current $I_{bias}$.

Referring to FIG. 3 and FIG. 4, during the phase #1, the bias current $I_{bias}$ flows through the memristor MR in the direction 101 such that a memristance R(t) of the memristor MR increases over time at a first rate. The first rate is dependent on the component characteristics of the memristor MR and the bias current $I_{bias}$. In other words, the representative voltage of the memristor MR, i.e., Vmr(t)=R(t)*$I_{bias}$, also increases over time. Further, the comparator 131 is configured to compare the representative voltage Vmr with the threshold voltage VH in the phase #1. Once the representative voltage Vmr exceeds the threshold voltage VH, the oscillating operation enters the phase #2.

During the phase #2, the logic circuit 132 changes the configurations of the switches SW1 to SW6 such that the bias current $I_{bias}$ flows through the memristor MR in the opposite direction (the direction 102), and thereby the memristance of the memristor MR decreases over time at a second rate. The second rate is dependent on the component characteristics of the memristor MR and the bias current $I_{bias}$. The decreasing rate (the second rate) of the memristance may be different from the increasing rate (the first rate) of the memristance. Then, the comparator 131 compares the representative voltage Vmr of the memristor MR with the threshold voltage VL in the phase #2. Once the representative voltage Vmr becomes lower than the threshold voltage VL, one oscillating cycle T1 is completed, and the oscillating operation enters the phase #1 of another oscillating cycle.

The oscillator shown in FIG. 4 performs oscillation to provide a clock signal. In some application examples, the comparison result Vcmp shown in FIG. 4 may be used as the clock signal. In other application examples, the representative voltage Vmr shown in FIG. 4 may be used as the clock signal. In still other application examples, one (or more than one) of the control signals S1 to S6 shown in FIG. 4 may be used as the clock signal.

Figure 5:
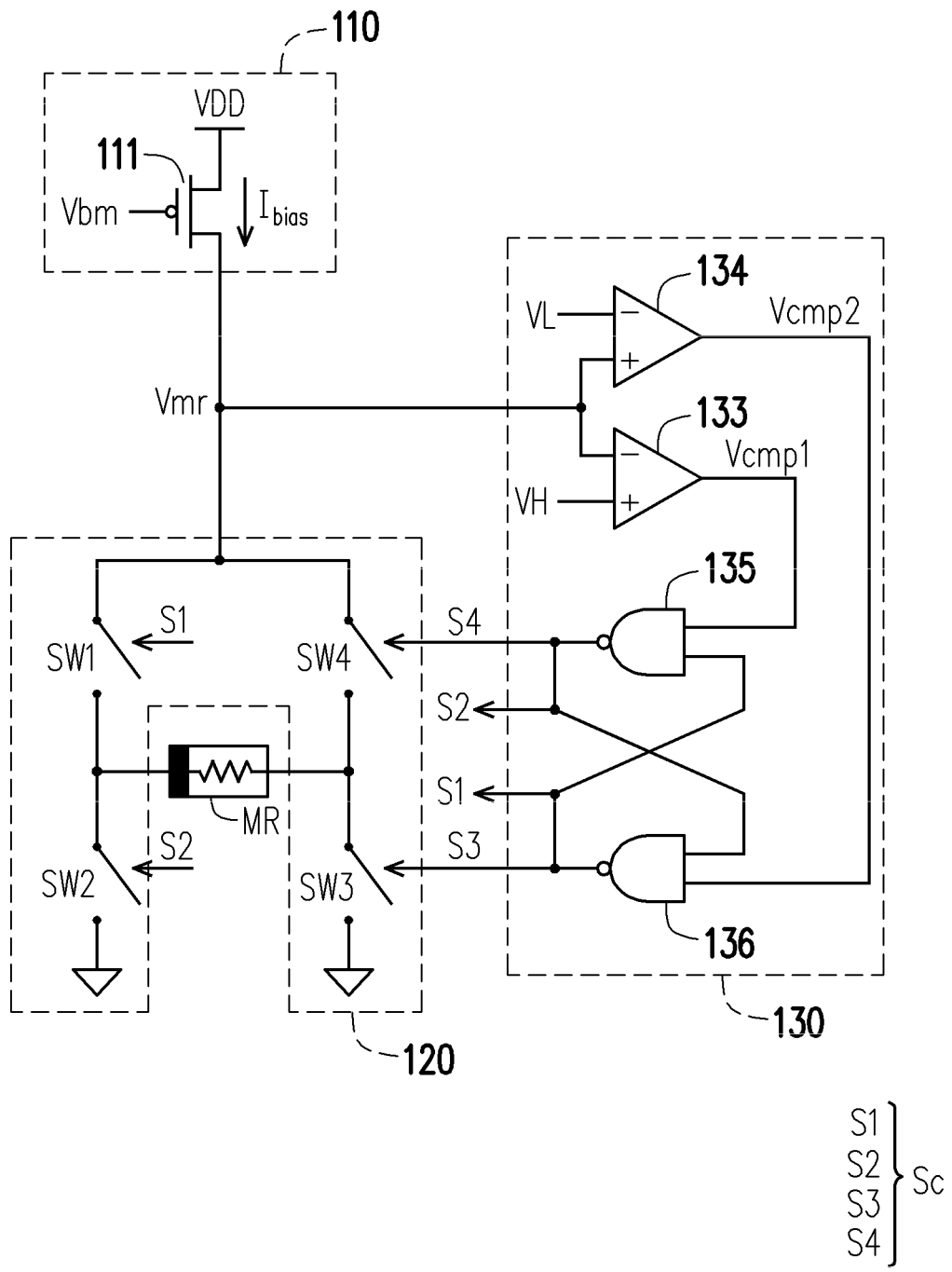
FIG. 5 is a circuit block diagram illustrating the control circuit shown in FIG. 1 according to another embodiment of the invention.

FIG. 5 is a circuit block diagram illustrating the control circuit 130 shown in FIG. 1 according to another embodiment of the invention. Reference may be made to the relevant descriptions of FIG. 4 for descriptions of the current source 110, the switching circuit 120, and the memristor MR shown in FIG. 5, which shall not be repeatedly described herein. Referring to FIG. 1 and FIG. 5, in the embodiment shown in FIG. 5, the control circuit 130 includes a comparator 133, a comparator 134, a NAND gate 135, and a NAND gate 136. The first input terminal (e.g., the non-inverting input terminal) of the comparator 133 is coupled to the threshold voltage VH. The second input terminal (e.g., the inverting input terminal) of the comparator 133 is coupled to the first terminal of the switch SW1 and the first terminal of the switch SW4 to receive the representative voltage Vmr of the memristor MR. The first input terminal of the comparator 134 is coupled to the first terminal of the switch SW1 and the first terminal of the switch SW4. The second input terminal of the comparator 134 is coupled to the threshold voltage VL.

The first input terminal of the NAND gate 135 is coupled to the output terminal of the comparator 133 to receive a comparison result Vcmp1. The output terminal of the NAND gate 135 provides the control signal S2 and the control signal S4 to the switch SW2 and the switch SW4. The first input terminal of the NAND gate 136 is coupled to the output terminal of the comparator 134 to receive a comparison result Vcmp2. The second input terminal of the NAND gate 136 is coupled to the output terminal of the NAND gate 135. The output terminal of the NAND gate 136 is coupled to the second input terminal of the NAND gate 135. The output terminal of the NAND gate 136 provides the control signal S1 and the control signal S3 to the switch SW1 and the switch SW3.

The oscillator shown in FIG. 5 may perform oscillation to provide a clock signal. In some application examples, one (or more than one) of the comparison results Vcmp1 and Vcmp2 shown in FIG. 5 may be used as the clock signal. In other application examples, the representative voltage Vmr shown in FIG. 5 may be used as the clock signal. In still other application examples, one (or more than one) of the control signals S1 to S6 shown in FIG. 5 may be used as the clock signal.

In summary of the above, in the oscillator of the embodiments of the invention, through performing the set operation and the reset operation on the memristor, the resistance value of the memristor can be increased/decreased. In other words, through changing the current flow direction of the memristor to increase/decrease the resistance value of the memristor, the representative voltage of the memristor is also increased/decreased. According to the relationship between the representative voltage Vmr of the memristor, the threshold voltage VH, and the threshold voltage VL, the control circuit may automatically change the flow direction of the bias current $I_{bias}$ in the memristor to perform oscillation. The control circuit may reduce or increase the representative voltage Vmr of the memristor by changing the current flow direction of the memristor when the representative voltage Vmr is higher than the threshold voltage VH or when the representative voltage Vmr is lower than the threshold voltage VL. Therefore, the representative voltage Vmr may oscillate back and forth between the threshold voltage VH and the threshold voltage VL.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An oscillator comprising:
   a current source;
   a memristor;
   a switching circuit, coupled to the current source and the memristor, and configured to transmit a bias current provided by the current source to the memristor through the switching circuit, and determine a flow direction of the bias current in the memristor through the switching circuit according to at least one control signal; and
   a control circuit, coupled to the switching circuit to provide the at least one control signal, and configured to detect a representative voltage of the memristor, wherein the control circuit comprises a comparator that is configured to compare the representative voltage of the memristor to at least one of a first threshold voltage or a second threshold voltage to generate a comparison result, and the control circuit changes the at least one control signal according to the comparison result to change the flow direction of the bias current in the memristor through the switching circuit.

2. The oscillator according to claim 1, wherein
   the oscillator is in a first phase in one oscillating cycle when the flow direction is a first direction and causes a resistance value of the memristor to increase,
   the oscillator is in a second phase in the one oscillating cycle when the flow direction is a second direction and causes the resistance value of the memristor to decrease,
   in the first phase, the control circuit compares the representative voltage with the first threshold voltage, and when the representative voltage of the memristor is not less than the first threshold voltage, the control circuit changes the at least one control signal to end the first phase and enter the second phase, and
   in the second phase, the control circuit compares the representative voltage with the second threshold voltage, and when the representative voltage of the memristor is not greater than the second threshold voltage, the control circuit changes the at least one control signal to end the second phase and enter the first phase, wherein the first threshold voltage is greater than the second threshold voltage.

3. The oscillator according to claim 1, wherein the switching circuit comprises:

a first switch, having a first terminal coupled to the current source to receive the bias current, wherein a second terminal of the first switch is coupled to a first terminal of the memristor, and a control terminal of the first switch is coupled to the control circuit to receive a first control signal;

a second switch, having a first terminal coupled to the first terminal of the memristor, wherein a second terminal of the second switch is coupled to a reference voltage, and a control terminal of the second switch is coupled to the control circuit to receive a second control signal;

a third switch, having a first terminal coupled to a second terminal of the memristor, wherein a second terminal of the third switch is coupled to the reference voltage, and a control terminal of the third switch is coupled to the control circuit to receive a third control signal; and a fourth switch, having a first terminal coupled to the current source to receive the bias current, wherein a second terminal of the fourth switch is coupled to the second terminal of the memristor, and a control terminal of the fourth switch is coupled to the control circuit to receive a fourth control signal.

4. The oscillator according to claim 3, wherein the control circuit turns on the first switch and the third switch and turns off the second switch and the fourth switch when the oscillator is in a first phase in one oscillating cycle, and the control circuit turns off the first switch and the third switch and turns on the second switch and the fourth switch when the oscillator is in a second phase in the one oscillating cycle.

5. The oscillator according to claim 3, wherein the control circuit comprises:

a fifth switch, having a first terminal coupled to the first threshold voltage;

a sixth switch, having a first terminal coupled to the second threshold voltage;

the comparator, having a first input terminal coupled to a second terminal of the fifth switch and a second terminal of the sixth switch, wherein a second input terminal of the comparator is coupled to the first terminal of the first switch and the first terminal of the fourth switch; and a logic circuit, having an input terminal coupled to an output terminal of the comparator to receive a comparison result, wherein the logic circuit provides the first control signal, the second control signal, the third control signal, the fourth control signal, a fifth control signal, and a sixth control signal according to the comparison result, wherein a control terminal of the fifth switch is coupled to the logic circuit to receive the fifth control signal, and a control terminal of the sixth switch is coupled to the logic circuit to receive the sixth control signal.

6. The oscillator according to claim 5, wherein the logic circuit turns on the first switch, the third switch, and the fifth switch and turns off the second switch, the fourth switch, and the sixth switch when the comparison result indicates that the representative voltage of the memristor is less than the first threshold voltage, and the logic circuit turns off the first switch, the third switch, and the fifth switch and turns on the second switch, the fourth switch, and the sixth switch when the comparison result indicates that the representative voltage of the memristor is greater than the second threshold voltage, wherein the first threshold voltage is greater than the second threshold voltage.

7. The oscillator according to claim 3, wherein the comparator comprises:

a first comparator, having a first input terminal coupled to the first threshold voltage, wherein a second input terminal of the first comparator is coupled to the first terminal of the first switch and the first terminal of the fourth switch; and a second comparator, having a first input terminal coupled to the first terminal of the first switch and the first terminal of the fourth switch, wherein a second input terminal of the second comparator is coupled to the second threshold voltage, wherein the first threshold voltage is greater than the second threshold voltage, and the control circuit further comprises:

a first NAND gate, having a first input terminal coupled to an output terminal of the first comparator, wherein an output terminal of the first NAND gate provides the second control signal and the fourth control signal to the second switch and the fourth switch; and a second NAND gate, having a first input terminal coupled to an output terminal of the second comparator, wherein a second input terminal of the second NAND gate is coupled to the output terminal of the first NAND gate, an output terminal of the second NAND gate is coupled to a second input terminal of the first NAND gate, and the output terminal of the second NAND gate provides the first control signal and the third control signal to the first switch and the third switch.

8. An operation method of an oscillator, comprising:

providing, by a current source, a bias current;

transmitting, by a switching circuit, the bias current provided by the current source to a memristor through the switching circuit;

detecting, by a control circuit, a representative voltage of the memristor;

comparing, by a comparator of the control circuit, the representative voltage of the memristor to at least one of a first threshold voltage or a second threshold voltage to generate a comparison result;

changing and providing, by the control circuit, at least one control signal according to the comparison result; and changing, by the switching circuit, a flow direction of the bias current in the memristor through the switching circuit according to the at least one control signal.

9. The operation method according to claim 8, wherein the oscillator is in a first phase in one oscillating cycle when the flow direction is a first direction and causes a resistance value of the memristor to increase, the oscillator is in a second phase in the one oscillating cycle when the flow direction is a second direction and causes the resistance value of the memristor to decrease, and the operation method further comprises:

in the first phase, comparing the representative voltage with the first threshold voltage by the control circuit, and when the representative voltage of the memristor is not less than the first threshold voltage, changing the at least one control signal by the control circuit to end the first phase and enter the second phase, and in the second phase, comparing the representative voltage with the second threshold voltage by the control circuit, and when the representative voltage of the memristor is not greater than the second threshold voltage, changing the at least one control signal by the control circuit to end the second phase and enter the first phase, wherein the first threshold voltage is greater than the second threshold voltage.

* * * * *